(12) United States Patent
Gschwendtberger

(10) Patent No.: US 8,282,428 B2
(45) Date of Patent: Oct. 9, 2012

(54) CONTACT BASE

(75) Inventor: Gerhard Gschwendtberger, Brannenburg (DE)

(73) Assignee: Multitest Elektronische Systeme GmbH, Rosenheim (DE)

( * ) Notice: Subject to any disclaimer, the term of this patent is extended or adjusted under 35 U.S.C. 154(b) by 245 days.

(21) Appl. No.: 12/742,888

(22) PCT Filed: Jun. 12, 2009

(86) PCT No.: PCT/EP2009/004245
§ 371 (c)(1),
(2), (4) Date: May 13, 2010

(87) PCT Pub. No.: WO2009/149949
PCT Pub. Date: Dec. 17, 2009

(65) Prior Publication Data
US 2010/0311285 A1 Dec. 9, 2010

(30) Foreign Application Priority Data
Jun. 12, 2008 (DE) .......................... 10 2008 028 034

(51) Int. Cl.
*H01R 4/48* (2006.01)

(52) U.S. Cl. ...................................... 439/816

(58) Field of Classification Search .................. 439/862, 439/816, 66, 74, 591, 68–73
See application file for complete search history.

(56) References Cited

U.S. PATENT DOCUMENTS

| 4,341,433 | A | | 7/1982 | Cherian et al. |
|---|---|---|---|---|
| 5,461,258 | A | | 10/1995 | Ideta et al. |
| 5,562,473 | A | * | 10/1996 | Ikeya et al. .................. 439/331 |
| 5,599,194 | A | | 2/1997 | Ozawa et al. |
| 5,908,324 | A | | 6/1999 | Ohshima et al. |
| 5,917,240 | A | | 6/1999 | Ideta et al. |
| 6,794,890 | B1 | | 9/2004 | Tokumo et al. |
| 7,256,598 | B2 | | 8/2007 | Leong |
| 7,361,023 | B2 | | 4/2008 | Wu |
| 2002/0033522 | A1 | | 3/2002 | Nagamine |
| 2003/0015347 | A1 | | 1/2003 | Eldridge et al. |
| 2004/0257100 | A1 | | 12/2004 | Leong |
| 2008/0094090 | A1 | | 4/2008 | Kimoto |

FOREIGN PATENT DOCUMENTS

| EP | 1 826 575 A2 | 8/2007 |
|---|---|---|
| WO | WO 2006/090947 A1 | 8/2006 |
| WO | WO 2008/046968 A1 | 4/2008 |

OTHER PUBLICATIONS

International Search Report of corresponding PCT/EP2009/004245, dated Oct. 21, 2009.

* cited by examiner

*Primary Examiner* — Jean F Duverne
(74) *Attorney, Agent, or Firm* — Christie, Parker & Hale, LLP

(57) ABSTRACT

In a contact base with a plurality of contact springs for making contact with electronic components, in particular ICs, the contact springs each have an elongate contact blade, the longitudinal center plane of said contact blade being situated parallel to the bending plane of the spring arm of the contact spring. Furthermore, the spring arm is formed in such a way that, when a pin is pressed, the contact blade moves in a direction which differs from the feed direction of the component in such a way that the contact blade moves along the pin.

16 Claims, 13 Drawing Sheets

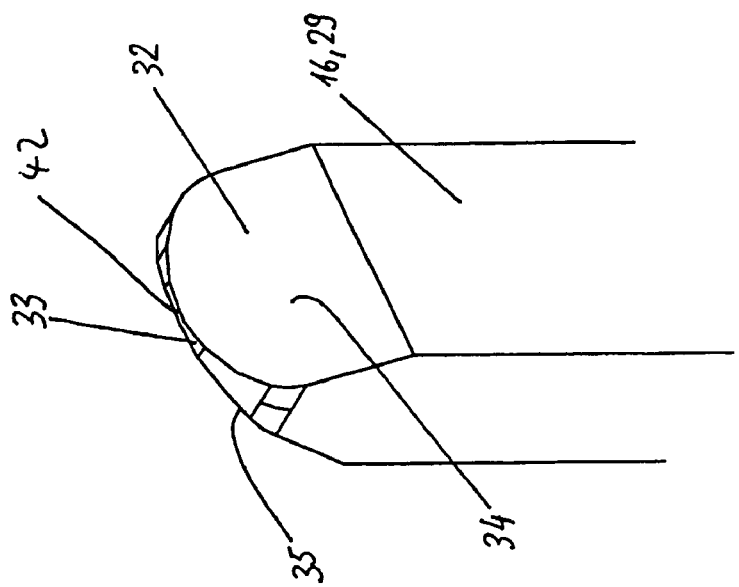
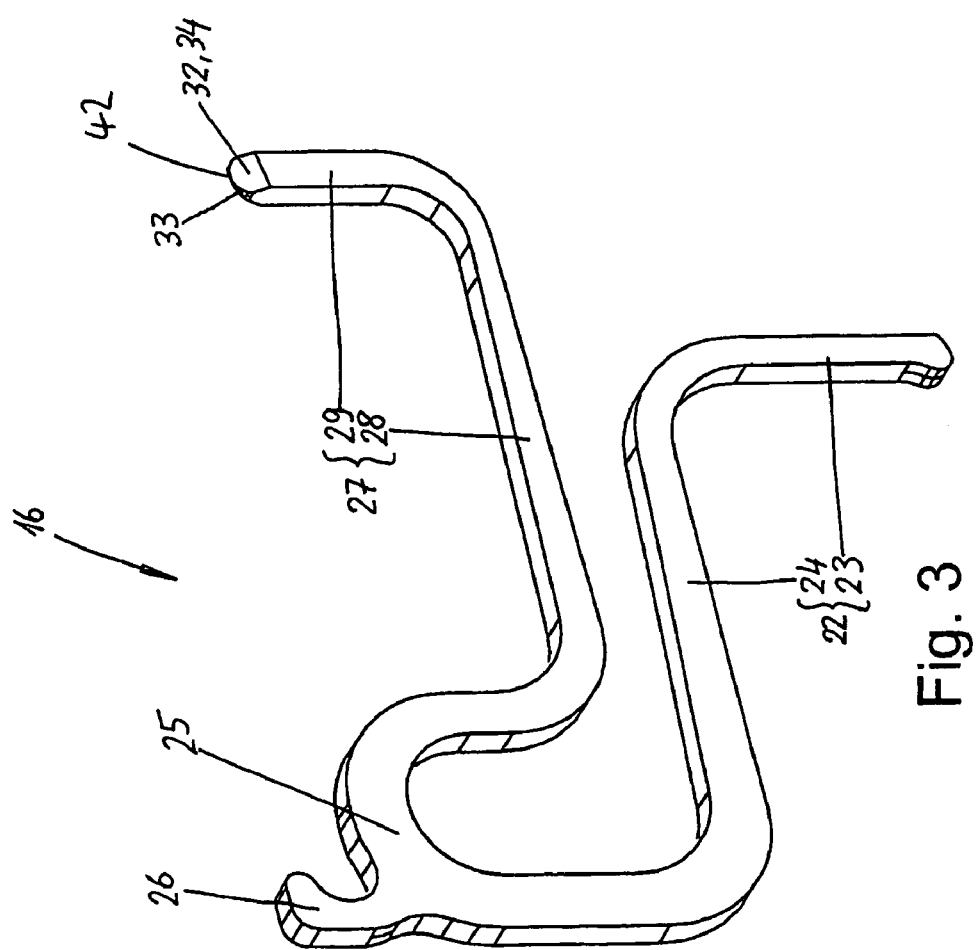
Fig. 4
Fig. 3

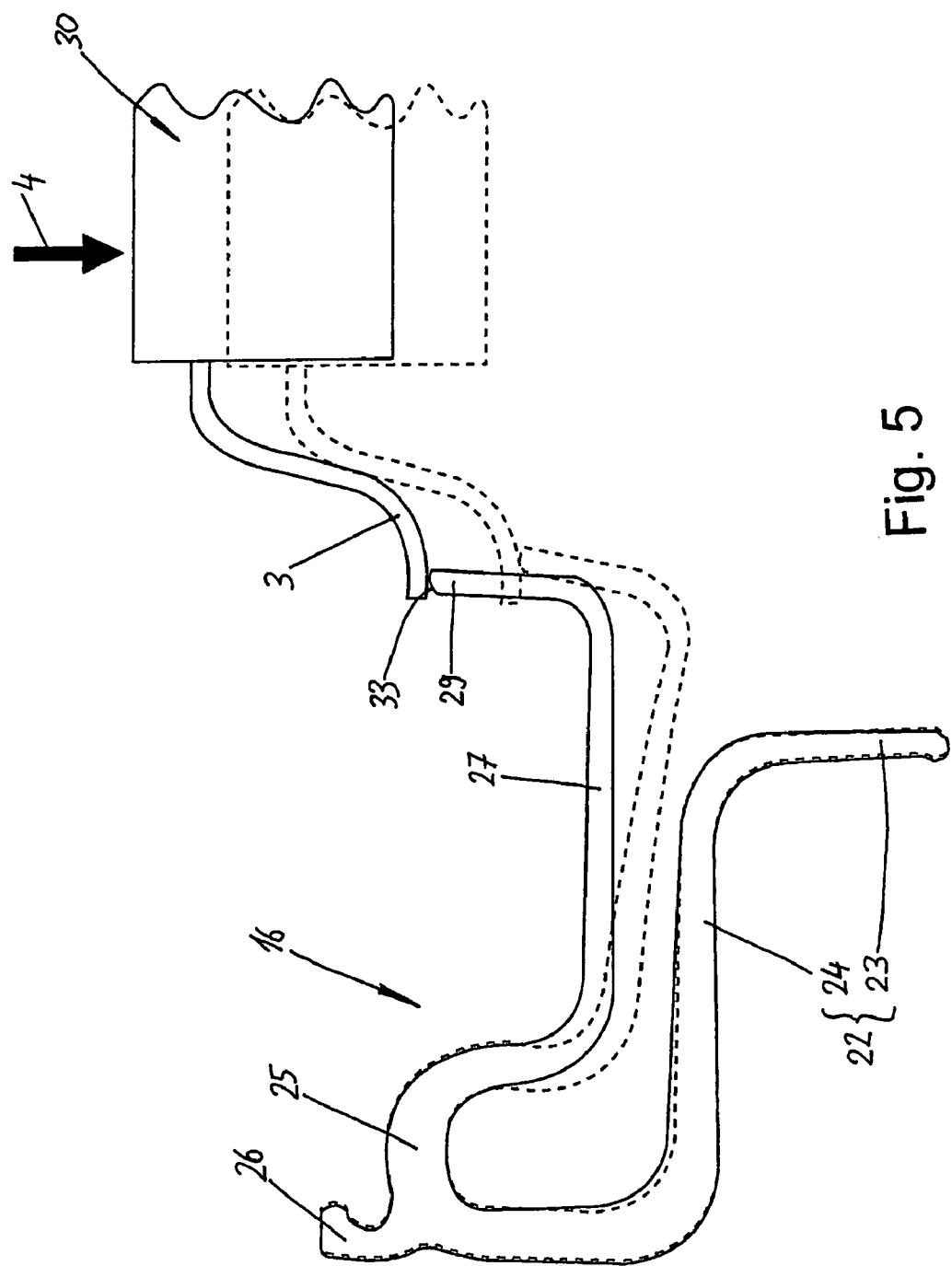

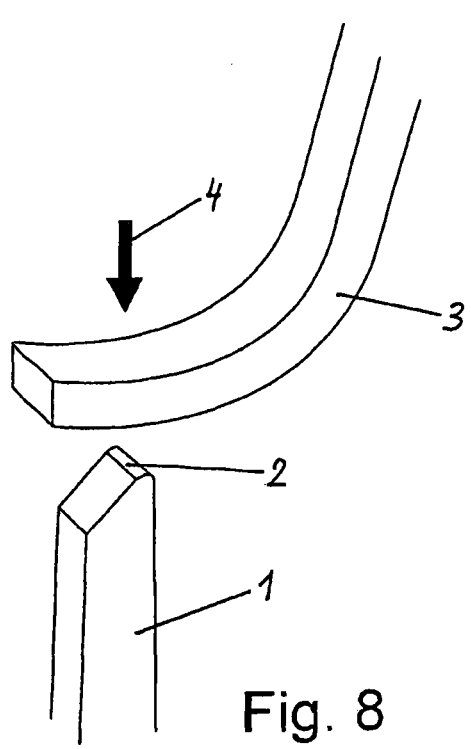
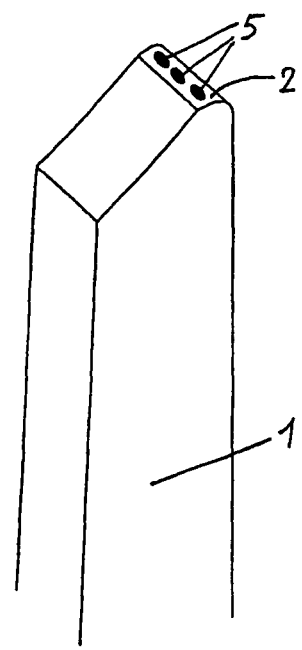
Fig. 8
Fig. 9

CONTACT BASE

CROSS-REFERENCE TO A RELATED APPLICATION

This application is a National Phase Patent Application of International Patent Application Number PCT/EP2009/004245, filed on Jun. 12, 2009, which claims priority of German Patent Application Number 10 2008 028 034.8, filed on Jun. 12, 2008.

BACKGROUND OF THE INVENTION

The invention relates to a contact spring and a contact base.

Contact bases of this kind include a plurality of contact springs, to which the pins (legs) of electronic components, particularly semiconductor components with integrated circuits (ICs), may be fitted in order to establish an electrical connection with an electronic device to which the contact socket is connected. An electronic device of such kind may be for example a test device having an electronic computing apparatus, which is used to test the function of the components before they are mounted on printed circuit boards or other substrates. In this context, the contact bases are typically secured to a panel-like contact base holder arranged on the tester, while the electronic components are advanced via an automatic handler, pressed against the contact springs of the contact base, and then removed from the contact bases when the test operation is completed so that the components can be sorted according to the result of the test.

As may be seen in FIGS. 8 and 9, on known contact bases the contact springs 1 used have a tip with a pitched cap and a contact blade 2 extending transversely. FIG. 8 also shows an end section of a pin 3 of an electronic component (IC). If an electronic component and thus also pins 3 of such component are fitted against assigned contact blades 2 of the contact springs in the direction of arrow 4, which indicates the infeed direction, the entire length of contact blade 2 is contact with pin 3. However, it is been found that, after long periods of use and a correspondingly large number of contacting operations, deposits are formed on such spring tips and contact blades, causing the contact resistance between contact blade 2 and pin 3 to rise significantly. This is particularly true if lead is not used in the alloy that is used for the pin coatings. For environmental reasons, tin is often used for these pin coatings instead of lead, and the alloy is softer than one made with lead. This appears to encourage the formation of deposits 5. Accordingly, perfect contacting with low contact resistance between contact springs 1 and pins 3 can no longer be guaranteed over a large number of contacting operations.

EP 1 826 575 A2 discloses a contact element for use in a test device that may be mounted on the load board of a test apparatus: the contact element, which is used to establish contact between at least one connector of a component to be tested and a corresponding track conductor on the load board, has a first end that defines a plurality of contact points. When the contact element is rotated about an axis generally perpendicular to a plane defined by the contact element, contact is created with contact points on the component to be tested one after the other.

U.S. Pat. No. 5,599,194 discloses a contact pin having a thin wall construction that creates good electrical connection with an IC socket, but does not allow isolation to occur due to the build-up of an oxidation layer on the surface of the connector. Moreover, the contact pin does not break easily due to plastic deformation.

U.S. Pat. No. 5,461,258 discloses a socket for semiconductor elements that prevents foreign bodies from adhering to the fastening surfaces of the external connectors of a semiconductor element.

US 2008/0094090 A1 discloses a test head for use with a base having small pitches that does not require cleaning. This is achieved by the provision of a z-shaped zone that is deflected elastically in a vertical direction, and a zΘ-shaped zone that is connected in series to the z-shaped zone and rotates while elastic deflection takes place at least in the vertical direction.

SUMMARY OF THE INVENTION

One object of the invention is therefore to provide contact springs and a contact base having contact springs ensuring that the contact resistance between the contact springs and the pins of the components remains as low and as constant as possible for a large number of contacting operations, regardless of the metal or metal alloy used for coating the pins.

This object is solved with a contact spring having the features of claim 1, and with a contact base having the features of claim 15. Advantageous embodiments of the invention are described in the other claims.

A contact base having a plurality of contact springs for making contact with electronic components, particularly ICs, wherein each contact spring has an elongate spring arm, the free end of which is furnished with an elongate contact blade, on which a pin of a component may be placed, wherein the spring arm is displaceable in a predefined bending plane by the movement of the component in the feed direction, is characterized in that the longitudinal centre plane of the contact blade is arranged parallel to the bending plane of the spring arm, and that the spring arm is constructed in such manner that, when a pin is pressed against it, the contact blade moves in a direction which differs from the feed direction of the component in such a way that the contact blade slides along the pin.

According to the invention, the longitudinal centre plane of the contact blade may be aligned parallel to the bending plane of the spring arm. In this context, the term "parallel" refers to angles up to +/−30°, up to +/−20°, and up to +/−10°, and particularly also the preferred case that the longitudinal centre plane of the contact blade is in the bending plane of the spring arm, that is to say +/−0°, that is to say, is coincident with the bending plane. Moreover, the spring arm is constructed in such manner that, when the pin is pressed against it, the contact blade moves in a direction that differs from the feed direction of the component in such manner that the contact blade slides along the pin.

It has been found that less deposits are formed with the contact springs of the invention, and the contact resistance between the contact springs and the pins remains low even after many contact operations.

According to one advantageous embodiment, the contact blade is located in the middle of the free end of the spring arm.

According to another advantageous embodiment, at least a part of the length of the contact blade is convex, particularly curved in a arc.

Alternatively, it is also possible that the contact blade is corrugated along its length.

According to another advantageous embodiment, the width of the contact blade in its middle area, when viewed in the longitudinal direction, is narrower than its end area.

It is particularly advantageous if the contact blade has a contact zone with a maximum width of 0.06 mm at its narrowest point, and a maximum width of 0.09 mm at its broadest point.

The length of the contact zone along which the pin slides is preferably 0.05 mm to 0.15 mm.

In the following, some terms will be defined that may apply for all embodiments described in this application.

Parallel may be understood to mean that an exact alignment of the longitudinal centre plane from the bending plane without angular deviation has proven to be advantageous. However, given the small dimensions of the contact springs, an angular deviation of up to 30°, 20° or 10° from the preferred angular deviation of 0° is possible due to production factors, such that parallel may be defined as follows: Parallel means that that the longitudinal centre plane between the contact blade and the bending plane of the spring arm has an angular deviation of up to 30°, that the longitudinal centre plane between the contact blade and the bending plane of the spring arm has an angular deviation of up to 20°, or that the longitudinal centre plane between the contact blade and the bending plane of the spring arm has an angular deviation of up to 10°.

The contact blade may be defined as that zone of the contact spring that is designed to establish electrical contact with the pin of the electronic component at least at points, over sections, or at times, to contact, penetrate or cut into it. Thus it is correct to speak of a contact blade. According to its definition, the contact blade may enclose the contact zone or it may only extend along the contact zone. The length of the contact blade may particularly be defined as that zone of the contact spring that extends along the longitudinal centre plane between the sides of the vertical end section. Alternatively, the length of the contact blade may also be defined by the region that extends between a first contact point on the longitudinal centre plane with an electronic component, that is to say a point at which these two elements are in contact for the first time, and a second contact point on the longitudinal centre plane with the second component, that is to say a point at which these two elements are in contact for the last time.

BRIEF DESCRIPTION OF THE DRAWINGS

In the following, the invention will be explained in greater detail with reference to the drawing. In the drawing:

FIG. 3 shows an individual contact spring, FIG. 4 is an enlarged view of the front end with contact blade, FIG. 5 shows the contact spring of FIG. 3 for various feed positions of the component, FIG. 8 shows the end section of a contact spring and a pin according to the related art, and FIG. 9 shows the end section of a contact spring according to the related art with deposits.

DETAILED DESCRIPTION OF THE DRAWINGS

Figure 1:
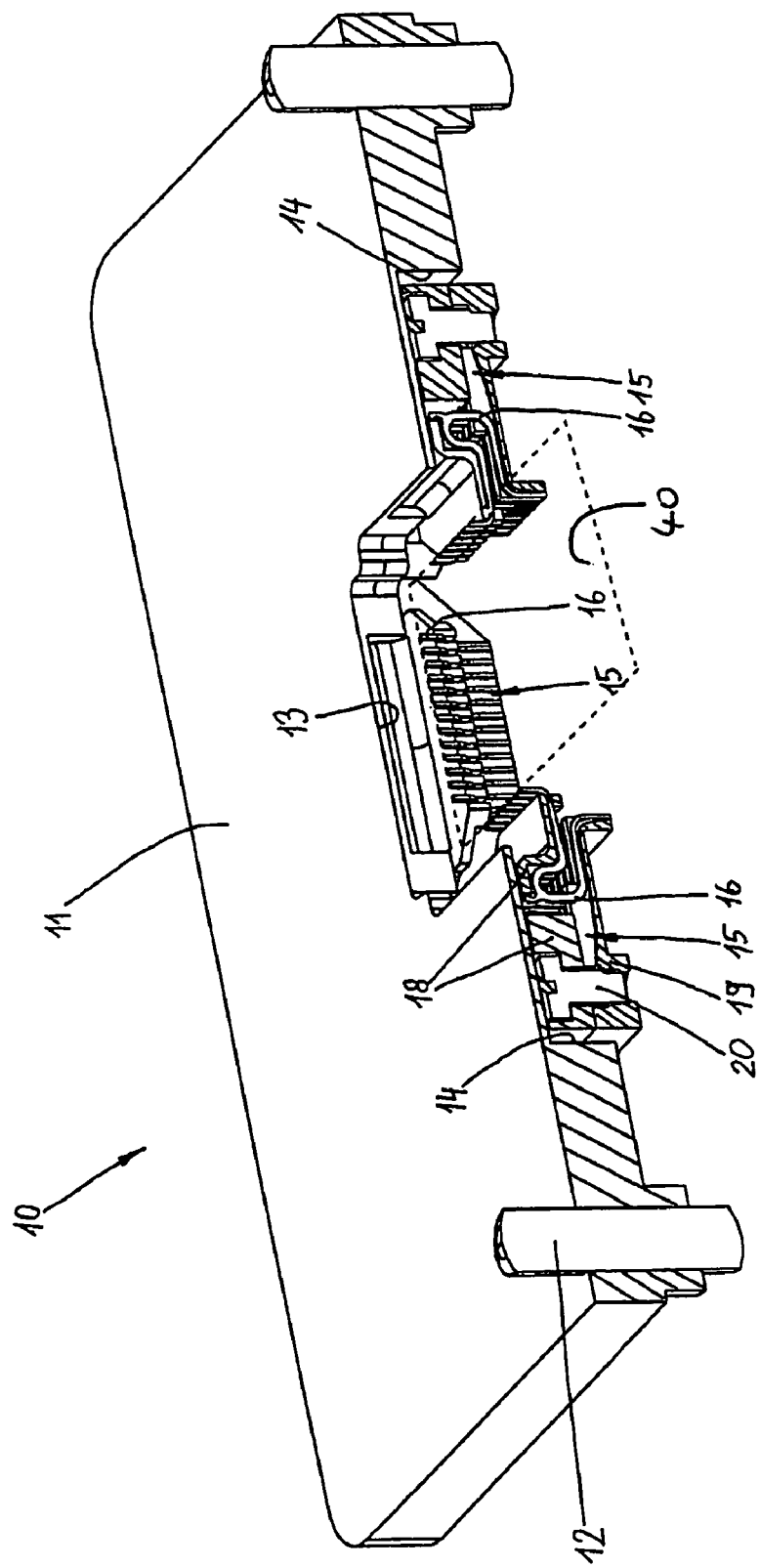
FIG. 1 shows a longitudinal cross section of a contact base according to the invention.
Figure 2:
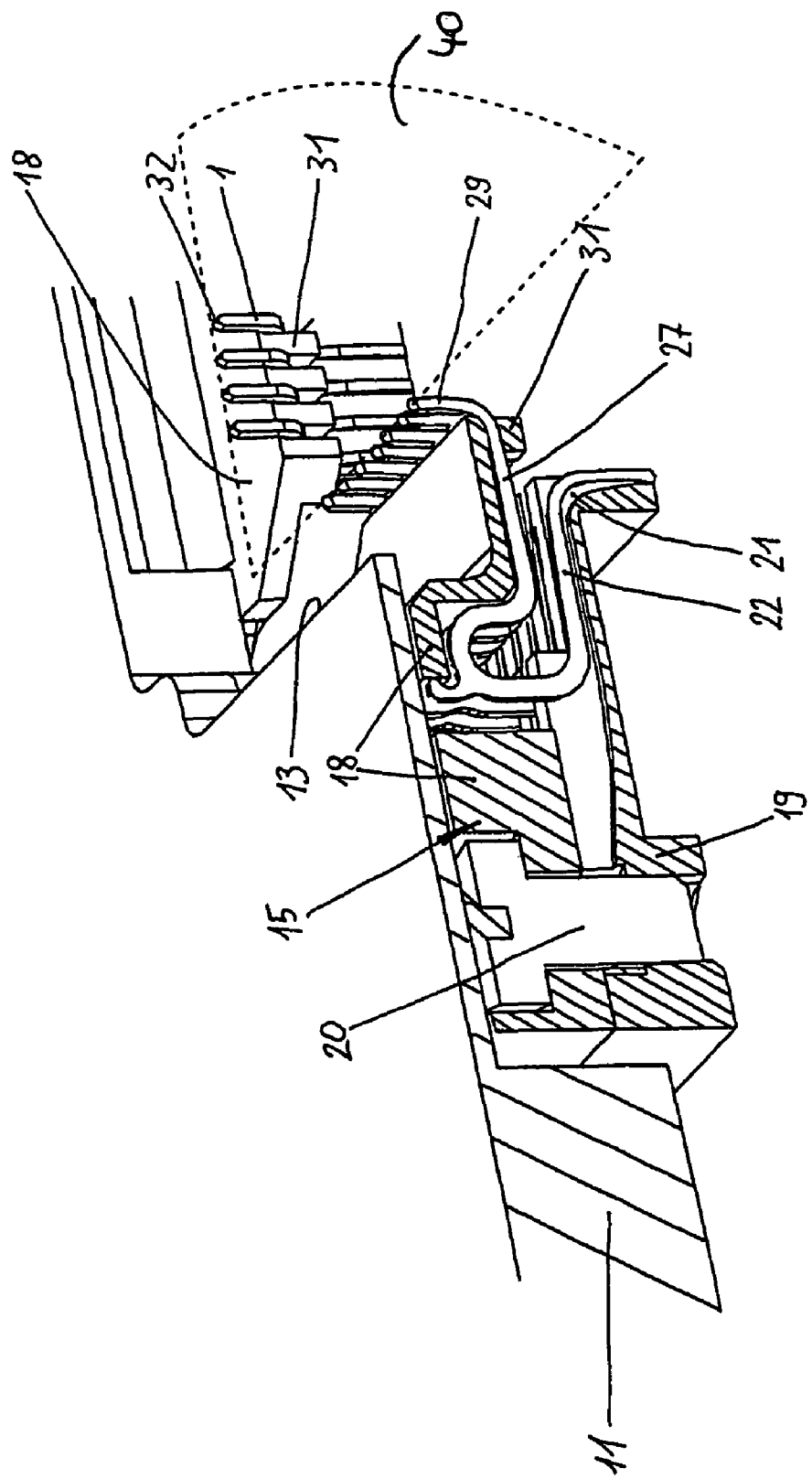
FIG. 2 shows a section of the contact base of FIG. 1 in an enlarged view.

FIGS. 1 and 2 show a part of a contact base 10 having an essentially rectangular base plate 11. Base plate 11 may be attached to a contact unit holder by its back side, which is located underneath in FIGS. 1 and 2, by means not shown, wherein the rear ends of centring pins 12 ensure that contact base 10 is centred precisely relative to the contact unit holder. The base plate 11 comprises, in known manner, a central cutaway 13, the dimensions of which are such that an electronic component, not shown, (a semiconductor component with integrated circuits) may be introduced therein while having a clearance to the side walls of cutaway 13.

The shape of cutaway 13 depends on the type of components that are to be contacted. In the embodiment shown, the plan shape of cutaway 13 is essentially rectangular to allow insertion of components 30 (FIG. 5) having essentially rectangular component bodies, from which pins 3 protrude on all four sides.

The underside of base plate 11 comprises four pocket-like cutaways 14, by which the central cutaway 13 is extended to all four sides. A spring clamping module 15 is located in each of cutaways 14 which holds a row of adjacently arranged contact springs 16 in a perfectly aligned attitude parallel to each other. The contact springs 16, which are of identical construction, are arranged in such manner that the upwardly curved free end sections 29 of contact springs 16 in each spring clamping module 15 form a straight row, wherein adjacent rows are respectively arranged perpendicularly to each other. Each free end section 29 is assigned to exactly one pin 3.

The spring clamping modules 15 each consists of an upper clamping part 18 and a lower clamping part 19, which is fixed to upper clamping part 18 via a screw 20. As is shown in FIG. 2, vertical, adjacent incisions 21 are provided in lower clamping part 19 for the individual contact springs 16, in which incisions a fixing section 22 of contact springs 16 may be inserted whereby the contact springs 16 are held in spring clamping module 15 in a precisely predefined position.

In the following the construction of a contact spring 16 is illustrated with reference to FIG. 3.

The contact spring 16 comprises the fixing section 22 mentioned earlier, which is L-shaped in the embodiment shown and includes a vertical bottom end section 23 and a horizontal section 24. A middle section 25 having the shape of an inverted U is attached to horizontal section 24. A stop lug 26 protrudes upwardly from the top of the upper part of middle section 25. An elongated, L-shaped spring arm 27 consisting of a horizontal section 28 a vertical end section 29 follows the middle section 25. All of the sections of contact spring 16 are arranged in the same principal plane, which in FIGS. 3 and 5 is represented as a vertical plane.

If, as is shown in FIG. 5, a pin 3 is put onto the free end of vertical end section 29 of contact spring 16 and moved downwards in the direction of arrow 4, spring arm 27 is deflected downwards, as indicated by the dashed lines. The stop lug 26 comes to rest against a vertical stop surface of upper clamping part 18, as is shown in FIG. 2. This prevents middle section 25 and fixing section 22 from being deformed excessively, and ensures that the deformation takes place mainly in transition zone 25 and in horizontal section 28. Thus, an even spring force and a defined bending behaviour is ensured in a simple way for all contact springs 16.

When component 30 is removed from contact springs 16 again, contact springs 16 move upwards again under their own spring force, returning to the position shown in FIG. 2 and by the solid lines in FIG. 5, which represents their home position. In this home position, as shown in FIG. 2, the horizontal sections 28 of contact springs 16 are resting against the underside of upper clamping part 18 due to its bias force. In this case the horizontal sections 28 engage in vertical incisions 31 that are provided for each contact spring 16 in the front zone of upper clamping part 18 and guide each contact spring 16 laterally, so that the vertical end sections 29 are positioned precisely.

As is shown in FIGS. 3 and 4, the free ends of each of the contact springs 16, i.e. the free end of spring arm 27, comprises a wedge-shaped tip 32 having an elongate contact blade 33, onto which a pin 3 may be placed (FIG. 5). The contact blade 33 is aligned longitudinally, not transversely, and is thus situated in the bending plane of spring arm 27. Seen from the side, contact blade 33 is curved, particularly arched. Furthermore, the contact blade 33 is arranged centrally, that is to say contact blade 33 is delimited on both sides by sloping sides 34, 35, which are arranged symmetrically about the vertical centre plane of contact spring 16. In the transverse direction the contact blade 33 is flat, whereas it is convex in the longitudinal direction. As a result of this configuration, the upper region of contact blade 33 is narrower than both of its end regions.

Figure 7:
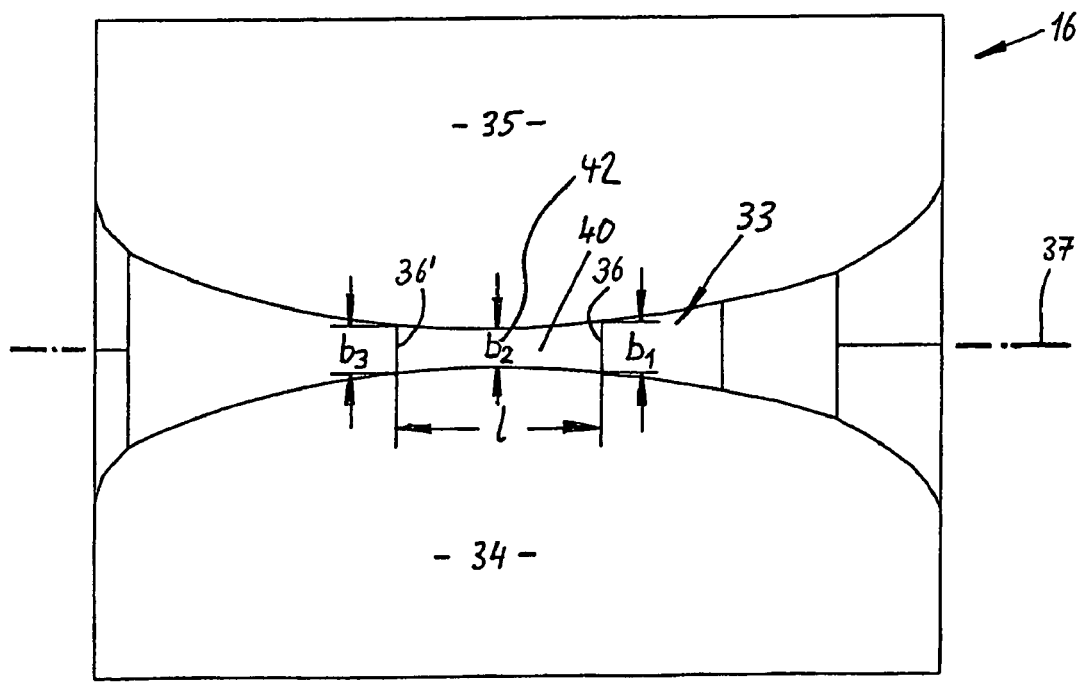
FIG. 7 is a plan view of the end zone of the contact spring with contact blade.

FIG. 7 is a plan view of the free end of a contact spring 16 having a contact blade 33. The vertical longitudinal centre plane of contact blade 33 is identified by the number 37. As is shown, this longitudinal centre plane 37 is coincident with the vertical centre plane of contact spring 16. The two boundary lines 38, 39 of the contact blade 33 extend symmetrically about longitudinal centre plane 37 and present an arch-shaped curve in plan view, wherein the distance between the two boundary lines 38, 39 is smallest close to the middle of contact blade 33, and becomes larger at the two opposite ends of contact blade 33.

During the contacting operation, only a portion of the length of the contact blade 33, specifically along contact zone 40, comes into contact with pin 3. This contact zone has a length of 0.05 mm to 0.15 mm. Roughly in the middle of this contact zone 40 is the narrowest section of contact blade 33, wherein the width b2 at this narrowest point is at most 0.06 mm, particularly 0.005 mm to 0.02 mm. On the one hand the contact zone 40 is delimited by contact point 36, where pin 3 first touches contact blade 33 when it is brought into contact therewith, and on the other hand by contact point 36', where pin 3 rests at the point of its closest approach to the contact base. The width b1 of the contact point 36, which represents the widest point of contact zone 40, is at most 0.09 mm, particularly 0.02 mm to 0.06 mm. The width b3 of the contact point 36' may be the same as or slightly narrower than the width b1.

It should be noted that the pin 3 always touches the contact zone 40 only along a thin contact line extending transversely to the longitudinal direction of the contact blade 33. When pin 3 is put on the contact blade 33, this contact line shifts from the contact point 36 across the narrowest point of the contact blade 33 to the contact point 36', resulting in a relative movement between contact blade 33 and pin 3 in the longitudinal direction of contact blade 33.

Figure 6:
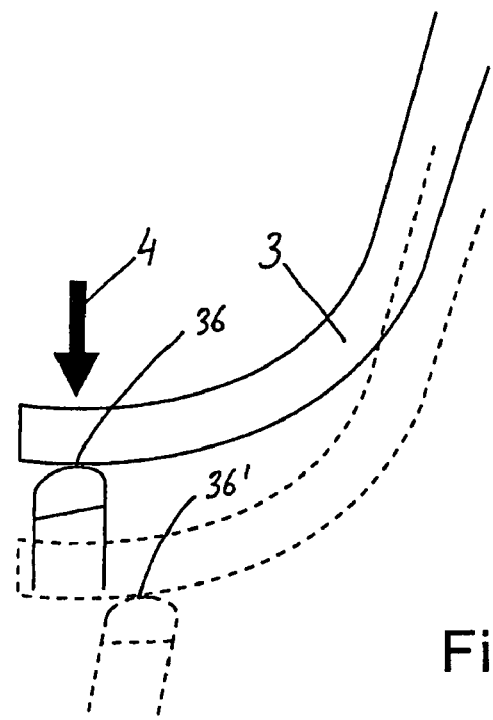
FIG. 6 is an enlarged view of the zone between the contact spring and pin of FIG. 5.

This sliding motion is also shown in FIG. 6. It may be seen that the free end of the spring arm 27 not only moves down when the assigned pin 3 comes into contact with the contact blade 33 and is pressed down further in the direction of arrow 4, but also moves horizontally along the pin 3, i.e. to the right as shown in FIG. 6, as is represented by the dashed lines. Thus, it comes to a sliding motion between contact blade 33 and pin 3, wherein the contact line or contact point 36 also shifts along the contact blade or along the pin 3, as is illustrated by contact point 36'. The shift movement takes place with relatively little resistance due to the longitudinal alignment of the contact blade 33. At the same time, deposits may be removed by this relative displacement. In this context, it may also be significant that the width of the contact point 36 changes due to the sliding motion, and the contact blade 33 becomes progressively wider after the narrowest zone has been passed. This may have a kind of "snowplough effect", pushing contamination present on the pin 3 to one side, so that the buildup of deposits on contact blade 33 is reduced thereby as well.

It should be noted that the terms "top", "bottom", "vertical" and "horizontal" refer to the contact base 10 and the individual parts thereof as they are shown in the figures. However, it is easily possible to arrange the contact base 10 not horizontally as shown, but in other alignments, particularly vertically. It is also possible to form the contact blade 33 not to be arch-shaped, as shown, but to be corrugated, so that multiple, particularly two, projections of the contact blade 33 come into contact with pin 3 successively, and a defined sliding motion in the longitudinal direction of contact blade 33 also takes place.

Figure 10:
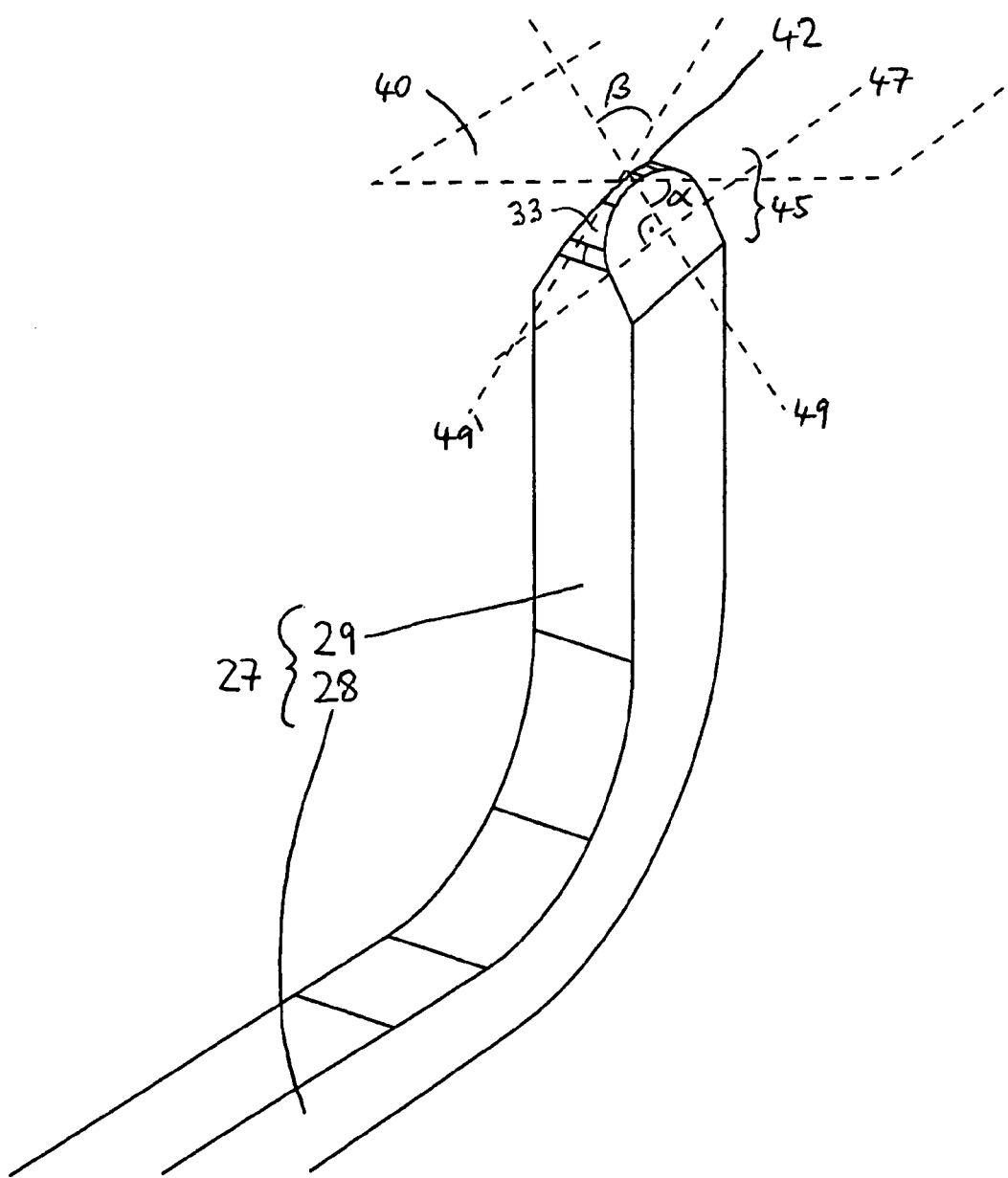
FIG. 10 shows a first variant of the L-shaped spring arm of a contact spring.

The shape and position of the L-shaped spring arm is exemplary described with reference to FIG. 10, and the same also applies similarly for FIGS. 11, 12, 13, 14, 15 and 16.

The L-shaped spring arm 27 of the contact spring 16 is comprises a horizontal section 28 and the adjoining end section 29 that curves vertically from horizontal section 28 towards contacting plane 40. The vertical end section 29 may protrude towards contacting plane 40 at any arbitrarily angle. The horizontal section 28 may lie in the bending plane of the contact spring 16. The vertical end section 29 comprises a spring end 45 at its free end by which the pins of the electronic components are contacted. The contact spring 16 is terminated on the contacting side by the spring end 45. The spring end 45 comprises two inclined planes 34, 35 and the contact blade 33, in particular the spring end 45 may consist of the two inclined planes 34 and 35 and the contact blade 33. Alternatively, the spring end may also comprise only one inclined plane or more than two inclined planes. The contact spring tip 42 is the area of the contact blade 33 that extends farthest toward the electronic component to be contacted. The inclined surface 34, 35 of the spring end is defined by a first principal axis 49 and a second principal axis 47. The first principal axis 47 of the inclined surface 34, 35 extends parallel to the longitudinal centre plane of the contact blade 33 and intersects the second principal axis 49 at a right angle, wherein the second principal axis 49 is inclined towards spring tip 42 from the vertical end section. The longitudinal centre plane of the contact blade 33 and the second principal axis 49 form an angle β/2 that may be in a range from 0° to 88°. Thus when they are designed symmetrically about the longitudinal centre plane of the contact blade 33, opposing inclined surfaces 34, 35 of spring end 45 form an angle between 0° and 176°. Accordingly, the shape of the spring end 45 may be described to be ridged roof, wherein the slopes of inclined surfaces 34, 35 may vary within a wide range.

Opposing inclined surfaces 34, 35 may also have different angles relative to the longitudinal centre plane, so that the construction need not be mirror-symmetrical about the longitudinal centre plane. If inclined surface 34, 35 is convex or not flat, the first principal axis 47 and the second principal axis 49 define a tangential plane to the inclined surface 34, 35, in which case the tangential plane satisfies the same conditions or comprises the same features as are satisfied and have been described for flat inclined surfaces 34, 35. In particular, the first principal axis 47 and the second principal axis 49 may touch inclined surfaces 34, 35 as tangents.

In any case, the inclined surface 34, 35, or the two or more inclined surfaces 34, 35 define a shape of the spring end 45 that tapers from the vertical end section 29 towards contact blade 33. Additionally, the contact blade has an elongate and convex shape wherein the direction of the contact blade 33 deviates at most +/−30°, at most +/−20, at most +/−10°, or not at all, that is to say 0°, from the bending plane of the contact spring 16 along its entire length.

The inclined, second principal axis 49 forms an angle from 2° to 90° with the contacting plane 40. In the most extreme cases, the inclined surface 34, 35 thus forms a roof-shaped spring end 45 that is formed very obtuse or very pointed, wherein the contact blade 33 is convex. In addition, the contact blade 33 may have an elongated shape in the vertical plan view that may be aligned parallel to the bending plane of the contact spring 16.

Figure 11:
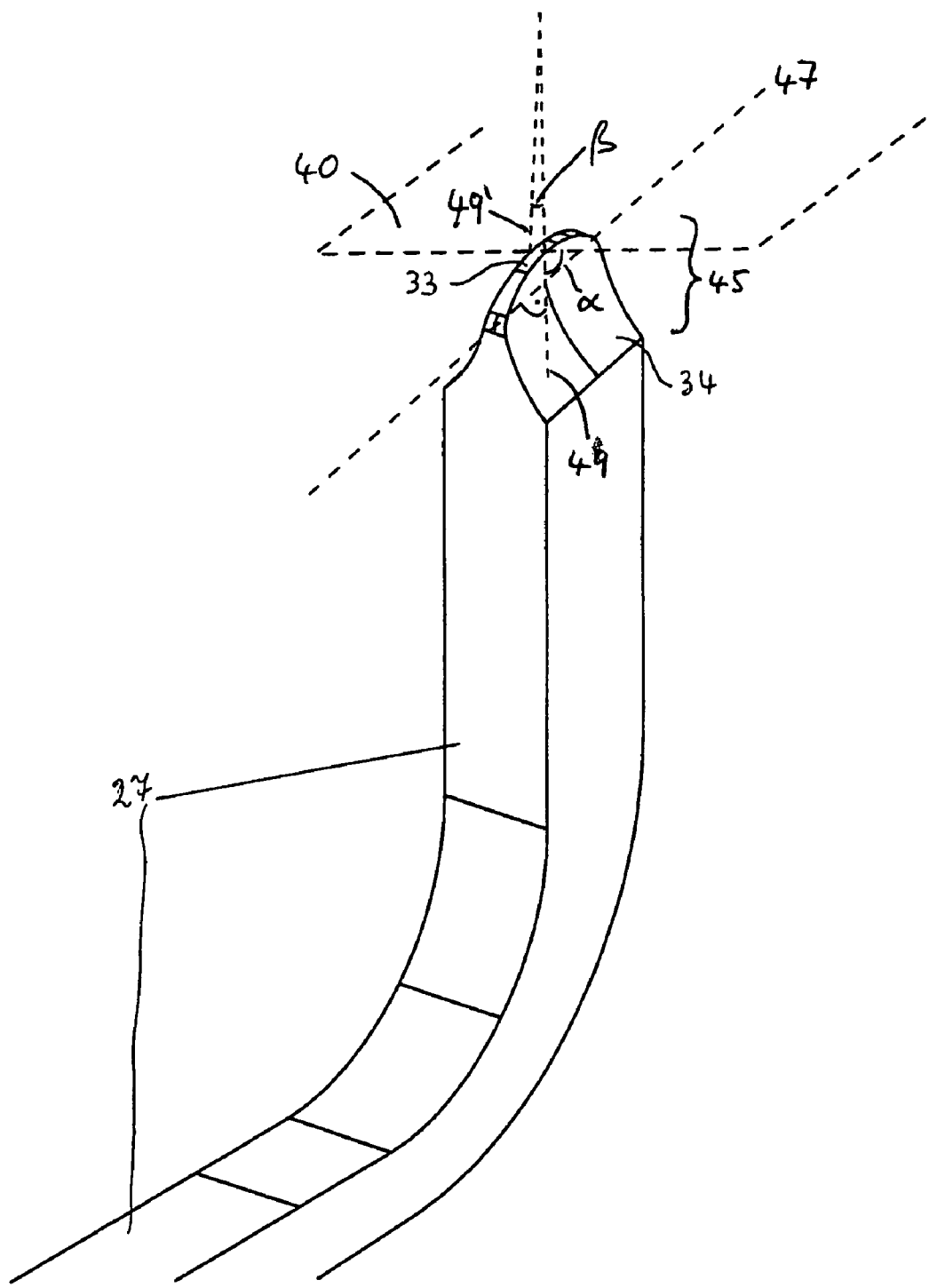
FIG. 11 shows a second variant of the L-shaped spring arm of a contact spring having a contact blade having a longer section of uniform thickness.

FIG. 11 shows the L-shaped spring arm 27 of the contact spring 16 according to a second embodiment, in which a longer area of the contact blade 33 is of uniform thickness. The inclined surfaces 34, 35 are formed concave, so that a longer area of the contact blade 33 is of uniform thickness. In this case, angle β may be very small, and in some cases may even be of negative value. Correspondingly, angle α may be very large, and have an absolute value greater than 90°.

Figure 12:
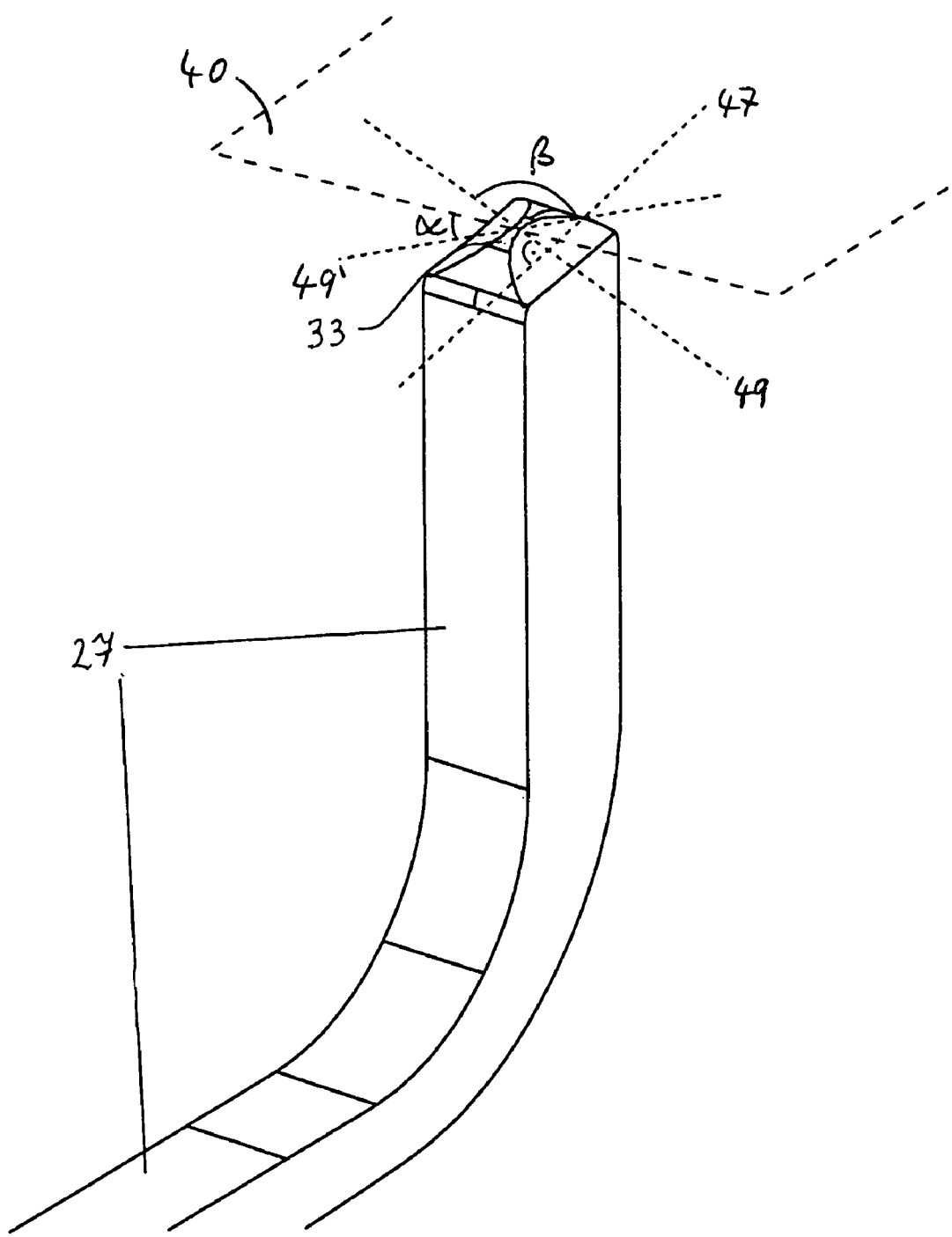
FIG. 12 shows a third variant of the L-shaped spring arm of a contact spring having a contact blade having a short section of uniform thickness.

FIG. 12 shows the L-shaped spring arm 27 of the contact spring 16 according to a third embodiment, in which only a short area of the contact blade 33 is of uniform thickness. In this case, angle β may have very large values, and in the extreme case may as large as 178°. Correspondingly, angle α may be very small, and have an absolute value less than 2°. In this case, contact blade 33 becomes much broader towards the ends.

Figure 13:
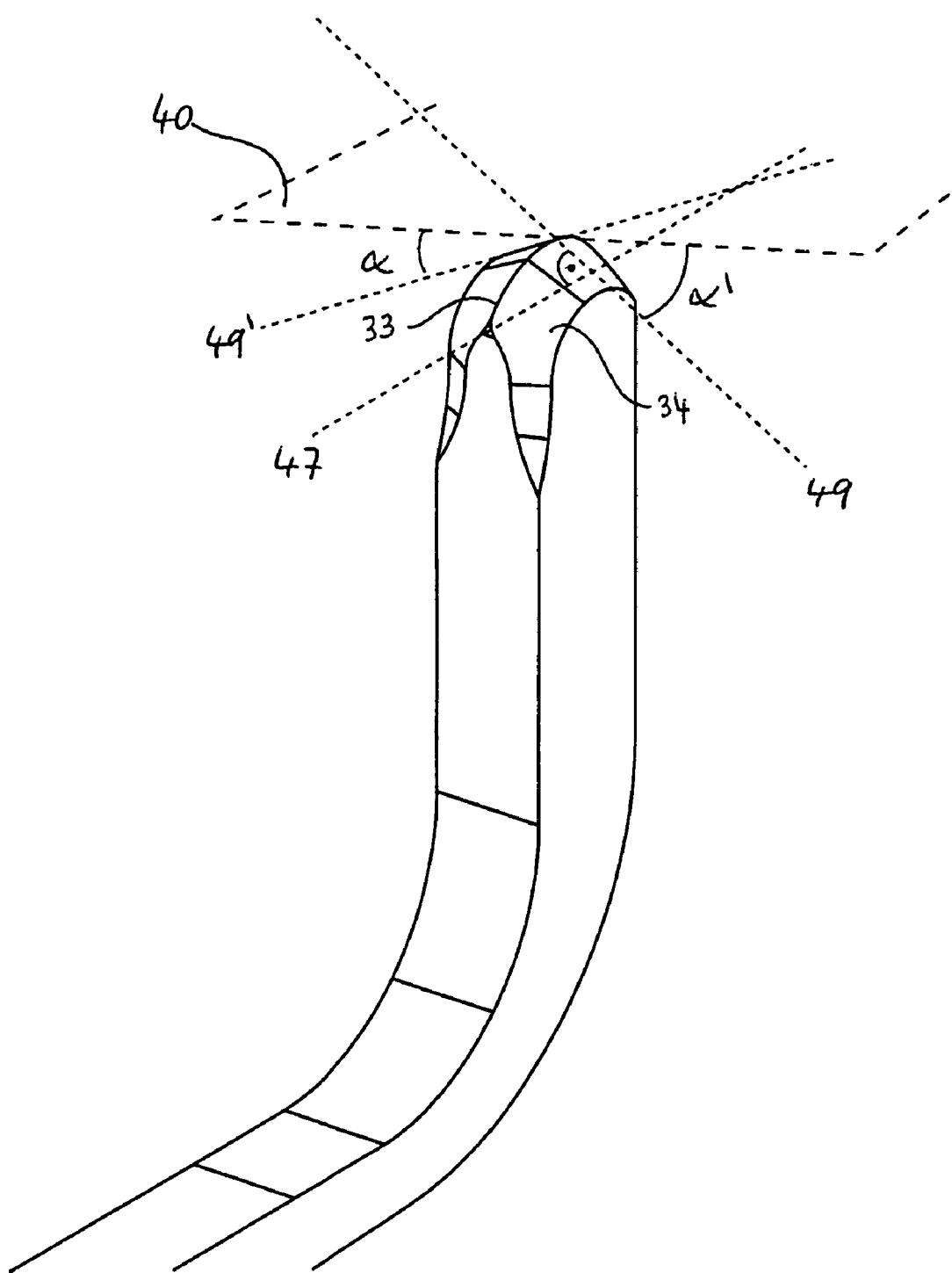
FIG. 13 shows a fourth variant of the L-shaped spring arm of a contact spring having a linearly shaped contact blade.

FIG. 13 shows the L-shaped spring arm of the contact spring with a linearly formed contact blade 33 according to a fourth embodiment. The linear contact blade 33 is created when inclined surfaces 34, 35 have a convex shape and extend towards contact blade 33 in such manner that the inclined surfaces 34, 35 meet in the middle at the point of the contact blade 33.

Figure 14:
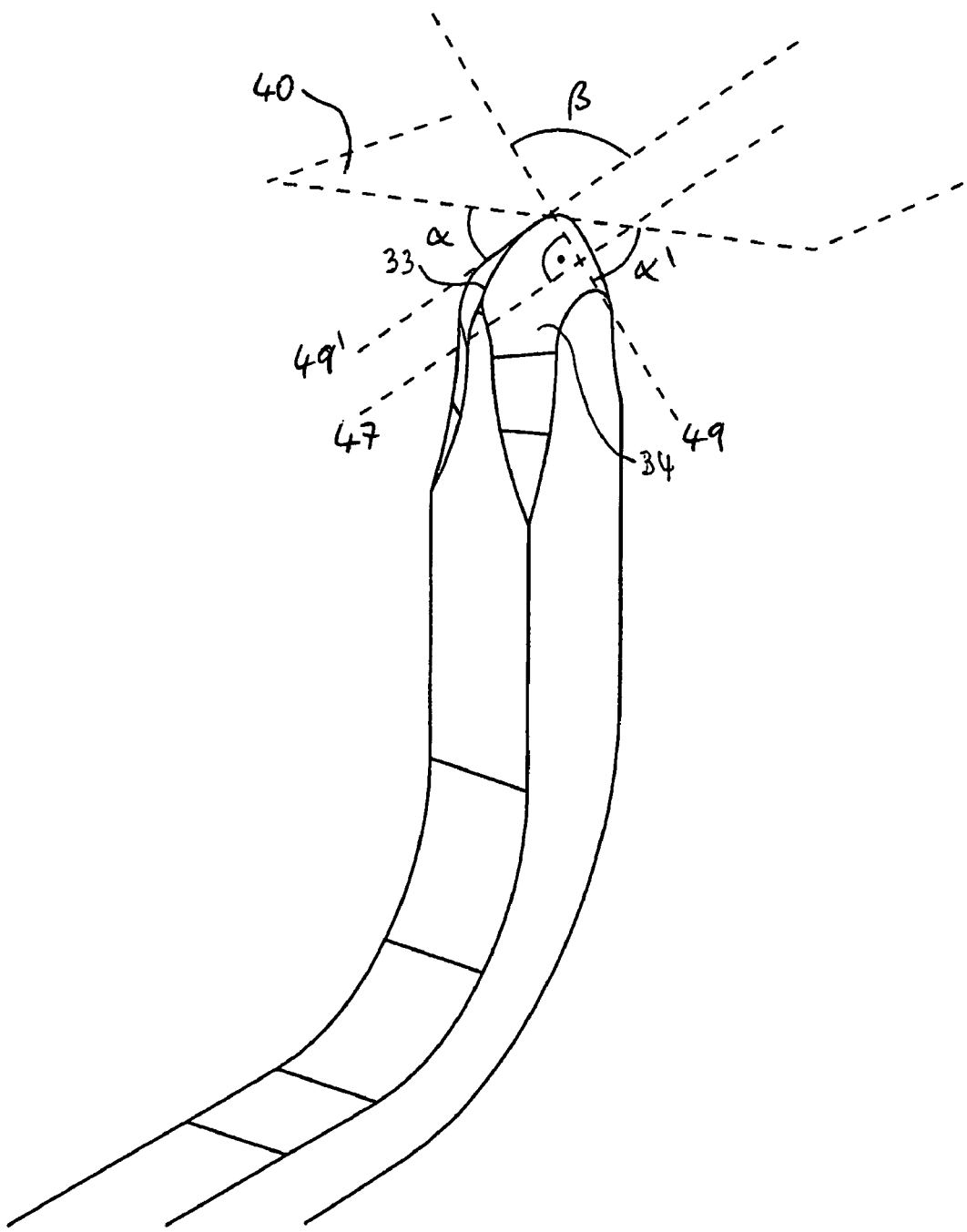
FIG. 14 shows a fifth variant of the L-shaped spring arm of a contact spring having a linearly shaped contact blade and highly convex curvature.

FIG. 14 shows the L-shaped spring arm of a contact spring with a linearly formed contact blade 33 and a steeply convex curvature according to a fifth embodiment. In this case, the inclined surfaces 34, 35 may be shaped the same way as shown in FIG. 13. The difference is that the inclined surfaces extend towards each other more steeply in the direction of the ends of the contact blade 33, so that the contact blade 33 is more steeply curved.

Figure 15:
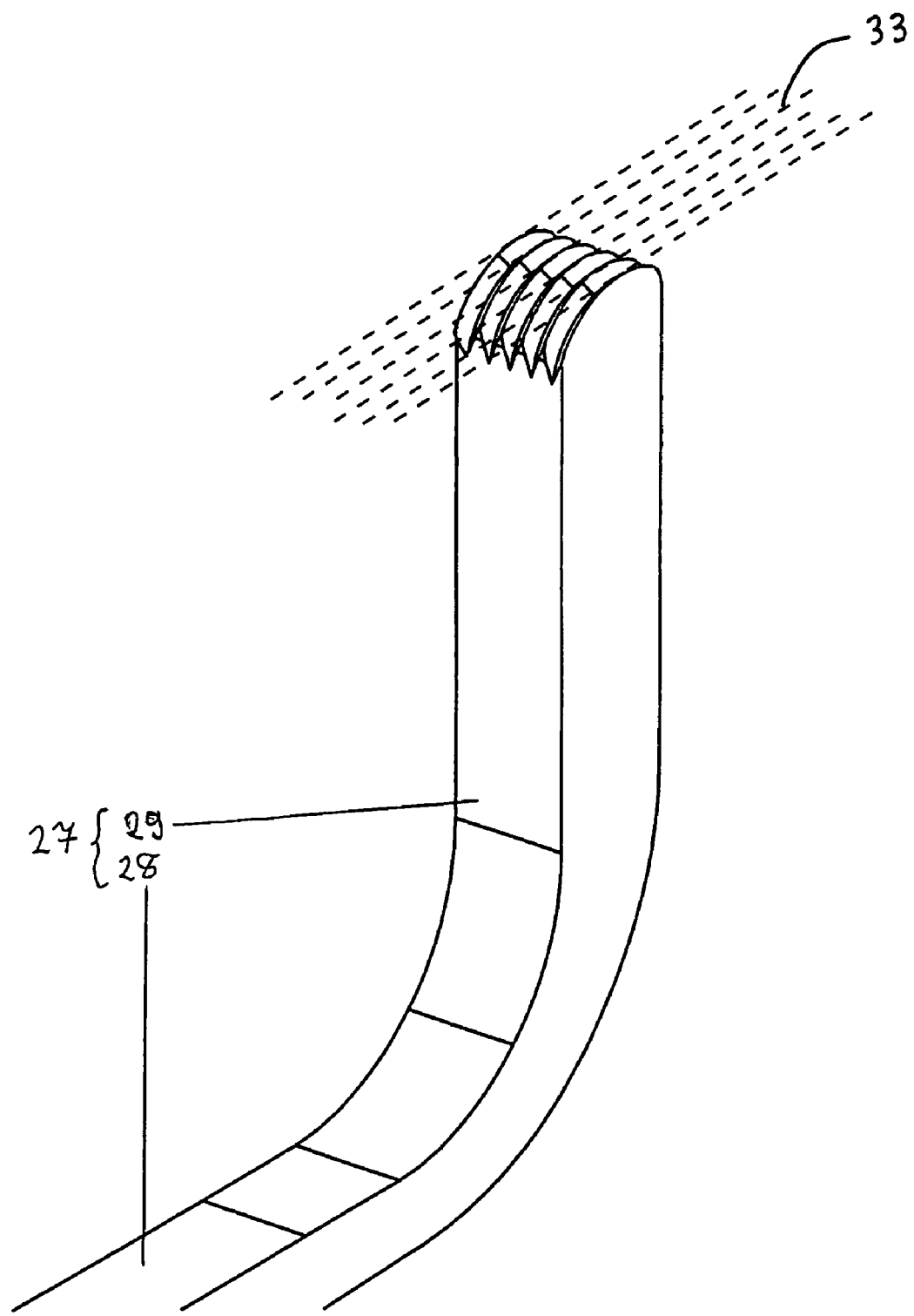
FIG. 15 shows a sixth variant of the L-shaped spring arm of a contact spring having multiple contact blades extending parallel to each other.

FIG. 15 shows the L-shaped spring arm of the contact spring with multiple parallel contact blades according to a sixth embodiment. In this case, convex contact blades 33 extend in the same direction and in the same bending plane, i.e. parallel to the horizontal section 28 of the spring arm 27.

Figure 16:
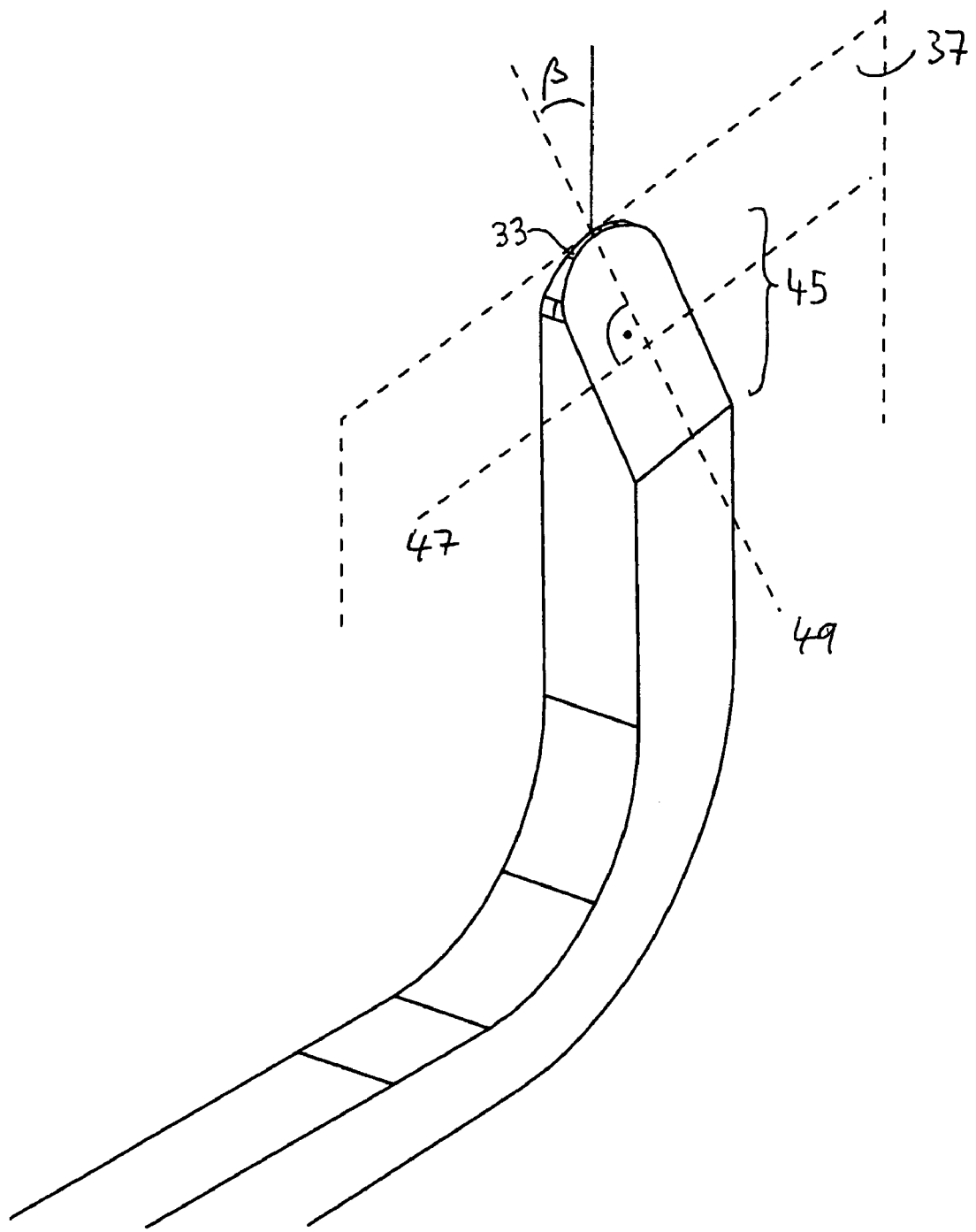
FIG. 16 shows a seventh variant of the L-shaped spring arm of a contact spring having a mono-pitch-type spring end.

FIG. 16 shows the L-shaped spring arm of the contact spring with a spring end in the shape of a ridged roof according to a seventh embodiment. The longitudinal centre plane of the contact blade 33 may represent, for a ridged roofed shaped end spring 45, the plane that extends at the lateral upper end of the spring end 45 and perpendicularly to the contact plane. In addition, the contact blade 33 located on the said lateral upper end of the spring end may also be convex in shape and extend in the direction of the bending plane of the spring arm.

The following serves to define certain terms that may apply particularly for FIGS. 10 to 16.

The contact plane 40 may be defined as the plane formed by the contact spring tips 42. The contacting plane or contact plane may also be defined as the plane that is formed either by the contact spring tips 42 or by the pins 3 of electronic component 30 during the contacting operation.

Accordingly the contacting plane is typically formed by the principal plane of the electronic component 30, or extends parallel with the principal plane of the electronic component 30 during the contacting operation.

The bending plane of contact spring 16 may be defined as the plane that is perpendicular to contacting plane 40. Furthermore, the bending plane of the contact spring 16 may extend perpendicularly to the sides of the cutaway 13 which clamps contact spring 16.

The invention claimed is:

1. A contact spring for contacting electronic components, particularly integrated circuits, wherein the contact spring comprises an elongate spring arm a free end of which comprises an elongate contact blade, on which a pin of a component may be placed, wherein the spring arm is displaceable in a predefined bending plane by movement of the component in a feed direction, wherein the longitudinal centre plane of the contact blade is arranged at an angle of at most +/−30°, particularly parallel, to the bending plane of the spring arm, wherein the spring arm is constructed in such manner that, when the pin is pressed on, the contact blade moves in a direction which differs from the feed direction of the component in such a way that the elongate contact blade shifts along the pin and wherein the elongate contact blade is convex for at least a part of its length, wherein the contact blade is curved in an arch over its length, and wherein a width of the contact blade is narrower in a middle area than in end areas.

2. The contact spring of claim 1, wherein the contact blade is arranged in a middle of the free end of the spring arm.

3. The contact spring of claim 1, wherein the contact blade has a corrugated faun along its length.

4. The contact spring of claim 1, wherein the contact blade has a contact zone that has a width of at most 0.06 mm at a narrowest point, and a width of at most 0.09 mm at a widest point.

5. The contact spring of claim 4, wherein a length of the contact zone over which the pin shifts is 0.05 mm to 0.15 mm.

6. The contact spring of claim 1, wherein the longitudinal centre plane of the contact blade is arranged at an angle of at most +/−20°, particularly parallel, to the bending plane of the spring arm.

7. The contact spring of claim 1, wherein the longitudinal centre plane of the contact blade is arranged at an angle of at most +/−10°, particularly parallel, to the bending plane of the spring arm.

8. The contact spring of claim 1, wherein the contact blade is continuously curved in a convex manner.

9. The contact spring of claim 1, wherein the contact spring comprises a spring end that comprises an inclined surface on the contact blade.

10. The contact spring of claim 9, wherein the spring end consists of one, two or more inclined surfaces on the contact blade.

11. The contact spring of claim 10, wherein the inclined surface comprises a first principal axis that inclines from a vertical end section of the spring arm relative to a spring tip of the contact spring, and the inclined surface comprises a second principal axis that is perpendicular to the first principal axis and extends parallel to the longitudinal centre plane of the contact blade.

12. A contact base having a plurality of contact springs, wherein each contact spring is for contacting electronic components, particularly integrated circuits, wherein the contact spring comprises an elongate spring arm, a free end of which comprises an elongate contact blade, on which a pin of a component may be placed, wherein the spring arm is displaceable in a predefined bending plane by movement of the component in a feed direction, wherein a longitudinal centre plane of the contact blade is arranged at an angle of at most +/−30°, particularly parallel, to the bending plane of the spring arm, wherein the spring arm is constructed in such manner that, when the pin is pressed on, the contact blade moves in a direction which differs from the feed direction of the component in such a way that the elongate contact blade shifts along the pin and wherein the elongate contact blade is convex for at least a part of its length, wherein the contact blade is curved in an arch over its length, and wherein a width of the contact blade is narrower in a middle area than in end areas.

13. The contact base of claim 12, wherein the contact blade is arranged in a middle of the free end of the spring arm.

14. The contact base of claim 12, wherein the contact blade has a contact zone that has a width of at most 0.06 mm at a narrowest point, and a width of at most 0.09 mm at a widest point.

15. The contact base of claim 14, wherein a length of the contact zone over which the pin shifts is 0.05 mm to 0.15 mm.

16. The contact base of claim 12, wherein the longitudinal centre plane of the contact blade is arranged at an angle of at most +/−20°, particularly parallel, to the bending plane of the spring arm.

* * * * *

UNITED STATES PATENT AND TRADEMARK OFFICE
CERTIFICATE OF CORRECTION

PATENT NO.        : 8,282,428 B2
APPLICATION NO.   : 12/742888
DATED             : October 9, 2012
INVENTOR(S)       : Gerhard Gschwendtberger It is certified that error appears in the above-identified patent and that said Letters Patent is hereby corrected as shown below:

In the Claims

Column 8, Claim 3, line 51            Delete "faun"

Insert -- form --

Signed and Sealed this
Eleventh Day of February, 2014

Michelle K. Lee
*Deputy Director of the United States Patent and Trademark Office*